United States Patent
Yao et al.

(10) Patent No.: US 11,086,060 B2
(45) Date of Patent: Aug. 10, 2021

(54) COLOR FILM SUBSTRATE, DISPLAY PANEL AND METHOD FOR DETECTING A DISPLAY PANEL

(71) Applicants: BOE TECHNOLOGY GROUP CO., LTD., Beijing (CN); FUZHOU BOE OPTOELECTRONICS TECHNOLOGY CO., LTD., Fujian (CN)

(72) Inventors: Liqing Yao, Beijing (CN); Xi Chen, Beijing (CN); Yao Liu, Beijing (CN); Zongxiang Li, Beijing (CN); Jiamin Liao, Beijing (CN)

(73) Assignees: BOE TECHNOLOGY GROUP CO., LTD., Beijing (CN); FUZHOU BOE OPTOELECTRONICS TECHNOLOGY CO., LTD., Fujian (CN)

(*) Notice: Subject to any disclaimer, the term of this patent is extended or adjusted under 35 U.S.C. 154(b) by 175 days.

(21) Appl. No.: 16/086,970

(22) PCT Filed: Dec. 13, 2017

(86) PCT No.: PCT/CN2017/115878
§ 371 (c)(1),
(2) Date: Sep. 20, 2018

(87) PCT Pub. No.: WO2018/161671
PCT Pub. Date: Sep. 13, 2018

(65) Prior Publication Data
US 2019/0101673 A1 Apr. 4, 2019
US 2021/0165143 A9 Jun. 3, 2021

(30) Foreign Application Priority Data
Mar. 8, 2017 (CN) .......................... 201710134007.6

(51) Int. Cl.
*G02B 5/20* (2006.01)
*G09G 3/00* (2006.01)
(Continued)

(52) U.S. Cl.
CPC ................ *G02B 5/201* (2013.01); *G02F 1/13* (2013.01); *G02F 1/1335* (2013.01); *G09G 3/006* (2013.01);
(Continued)

(58) Field of Classification Search
CPC ............. G02F 1/1309; G02F 1/136259; G02F 2001/136263; G02F 1/133512;
(Continued)

(56) References Cited

U.S. PATENT DOCUMENTS

2002/0101547 A1* 8/2002 Lee ................... G02F 1/136204
349/40
2005/0078240 A1* 4/2005 Murade ............. G02F 1/136209
349/110

(Continued)

FOREIGN PATENT DOCUMENTS

CN 1290922 A 4/2001
CN 1573444 A 2/2005
(Continued)

OTHER PUBLICATIONS

PCT International Search Report, Application No. PCT/CN2017/115878, dated Mar. 23, 2018, 6 pages: with English translation.
(Continued)

*Primary Examiner* — John A McPherson
(74) *Attorney, Agent, or Firm* — Armstrong Teasdale LLP

(57) ABSTRACT

The present disclosure relates to a color film substrate, a display panel and a method for detecting a display panel. The CF substrate includes a display region and a peripheral region corresponding to a dummy pixel region around the
(Continued)

display region. A black matrix of the color filter substrate includes a light transmitting section in a portion of the peripheral region corresponding to a dummy pixel unit. The light transmitting section includes a first set of light transmitting sections and a second set of light transmitting sections. Each of the first and second set of light transmitting sections is respectively in a portion that extends along a first side and a second side which is opposite to the first side of the display region and corresponds to the dummy pixel unit.

18 Claims, 14 Drawing Sheets

(51) Int. Cl.
*H01L 27/12* (2006.01)
*G02F 1/13* (2006.01)
*G02F 1/1335* (2006.01)

(52) U.S. Cl.
CPC ... *H01L 27/124* (2013.01); *G09G 2300/0413* (2013.01)

(58) Field of Classification Search
CPC ... G02F 1/133516; G02F 2001/133388; G02F 1/136263; G02F 1/133388; G09G 3/006; G09G 2300/0413; G03F 7/0007; G02B 5/201; G02B 5/223
USPC ..................................... 430/7; 349/106, 110
See application file for complete search history.

(56) References Cited

U.S. PATENT DOCUMENTS

| | | | |
|---|---|---|---|
| 2007/0154819 | A1 | 7/2007 | Chen |
| 2013/0286315 | A1 | 10/2013 | Yanagisawa |
| 2016/0020261 | A1* | 1/2016 | Kim .................... G09G 3/3208 362/235 |

FOREIGN PATENT DOCUMENTS

| | | |
|---|---|---|
| CN | 1873484 A | 12/2006 |
| CN | 103698934 A | 4/2014 |
| CN | 104317158 A | 1/2015 |
| CN | 104981907 A | 10/2015 |
| CN | 105243994 A | 1/2016 |
| CN | 205507317 U | 8/2016 |
| CN | 105954908 A | 9/2016 |
| CN | 106405924 A | 2/2017 |
| JP | 2004347659 A | 12/2004 |
| JP | 2006164690 A | 6/2006 |

OTHER PUBLICATIONS

PCT Written Opinion, Application No. PCT/CN2017/115878, dated Mar. 23, 2018, 5 pages.: with English translation of relevant part.
China First Office Action, Application No. 201710134007.6, dated Feb. 27, 2020, 26 pps.: with English translation.
European Extended Search Report, Application No. 17899860.5, dated Jan. 28, 2021, 8 pps.

* cited by examiner detecting a display state of the light transmitting section of the color filter substrate  S1 determining whether the line is abnormal according to the display state of the light transmitting section  S3

COLOR FILM SUBSTRATE, DISPLAY PANEL AND METHOD FOR DETECTING A DISPLAY PANEL

CROSS REFERENCE TO RELATED APPLICATIONS

This patent application is a National Stage Entry of PCT/CN2017/115878 filed on Dec. 13, 2017, which claims the benefit and priority of Chinese Patent Application No. 201710134007.6 filed on Mar. 8, 2017, the disclosures of which are incorporated herein by reference in their entirety as part of the present application.

BACKGROUND

The present disclosure relates to the field of display technology. Specifically, the disclosure relates to a color film substrate, a display panel, and a method for detecting a display panel.

Defective lines may appear in the display device. The conventional method of confirming the defective line identifier of the display device is accomplished by using a lighter to light up the screen marker and a microscope with a reflection light to search the defective line. This method requires the use of a lighter and a microscope at the same time. It is necessary to confirm the identifier of defective lines one by one for a plurality of defective lines. Thus, the conventional method takes a lot of time and labor, and cannot quickly confirm whether the abnormal dots are located inside the display region or not.

BRIEF DESCRIPTION

An embodiment of the present disclosure provides a color filter substrate, a display panel, and a method for detecting a display panel.

The present disclosure provides a color film substrate.

A first aspect of the present disclosure provides a color film substrate. The color filter substrate includes a display region and a peripheral region corresponding to a dummy pixel region around the display region. A black matrix of the color filter substrate includes a light transmitting section in a portion of the peripheral region corresponding to a dummy pixel unit. The light transmitting section includes a first set of light transmitting sections and a second set of light transmitting sections. Each of the first set of light transmitting sections is in a portion that extends along a first side of the display region and corresponds to the dummy pixel unit. Each of the second set of light transmitting sections is in a portion that that extends along a second side, opposite to the first side, of the display region and corresponds to the dummy pixel unit.

In an embodiment, the light transmitting section includes an opening in the black matrix.

In an embodiment, the openings in each of the first set of light transmitting sections and the second set of light transmitting sections respectively have a sequentially arranged number of shapes.

In an embodiment, the light transmitting section includes an opening in the black matrix and a light-shielding region in the opening.

Wherein, the light-shielding regions of the openings in each of the first set of light transmitting sections and the second set of light transmitting sections respectively have sequentially arranged shape of numbers.

In an embodiment, the light transmitting section further includes a third set of light transmitting sections and a fourth set of light transmitting sections. Each of the third set of light transmitting sections is in a portion that extends along a third side of the display region adjacent to the first side and corresponds to the dummy pixel unit. Each of the fourth set of light transmitting sections is in a portion that extends along a fourth side, opposite to the third side, of the display region and corresponds to the dummy pixel unit.

The present disclosure also provides a display panel.

A second aspect of the present disclosure provides a display panel. The display panel includes the color filter substrate as described above and an array substrate disposed opposite to the color filter substrate.

In an embodiment, the light transmitting section of the color filter substrate and a light-transmitting region in the dummy pixel region of the array substrate are aligned such that light from the light-transmitting region can pass through the black matrix of the color filter substrate.

In an embodiment, the array substrate includes a display region and a dummy pixel region around the display region. The display region has a plurality of pixel units defined by gate lines and data lines intersecting one another. The dummy pixel region has a plurality of dummy pixel units defined by the gate lines and the data lines intersecting one another. The dummy pixel region has marks located in the dummy pixel unit. The marks include a first set of marks and a second set of marks. Each mark in the first set of marks is in the dummy pixel unit extending along a first side of the display region. Each mark in the second set of marks is in the dummy pixel unit extending along on a second side, opposite to the first side, of the display region. The light transmitting section of the color filter substrate is aligned with the mark in the array substrate, so that the light from the mark can transmit through the black matrix.

In an embodiment, an extending direction of the first side and the second side is consistent with one of an extending direction of the gate line and an extending direction of the data line.

In an embodiment, the light transmittance of the mark is greater than the light transmittance of other portions of the dummy pixel unit.

In an embodiment, the mark is in a gate metal layer of a thin film transistor of the array substrate.

In an embodiment, the mark includes an opening in the gate metal layer.

In an embodiment, the openings of each of the first set of marks and the second set of marks respectively have a shape of numbers arranged in sequence.

In an embodiment, the mark includes an opening in the gate metal layer and a light shield located within the opening.

In an embodiment, the light shielding portions of each of the first set of marks and the second set of marks have a shape of numbers arranged in sequence.

In an embodiment, an extending direction of the mark is consistent with an extending direction of the gate line, and a length of the dummy pixel unit in an extending direction of the data line is smaller than a length of the pixel unit in an extending direction of the data line.

In an embodiment, the mark further includes a third set of marks and a fourth set of marks. Each mark in the third set of marks is in the dummy pixel unit extending along a third side of the display region adjacent to the first side. Each of the marks of the fourth set of marks is in the dummy pixel unit extending along a fourth side, opposite to the third side, of the display region.

In an embodiment, an extension direction of the third side and the fourth side is consistent with the other one of the extension direction of the gate line and the extension direction of the data line.

The present disclosure also provides a method for detecting a display panel.

A third aspect of the present disclosure provides a method for detecting a display panel. The display panel includes the display panel as described above, and the method includes detecting a display state of the light transmitting section of the color filter substrate, and determining whether the line is abnormal according to the display state of the light transmitting section.

In an embodiment, determining whether the line is abnormal according to the display state of the light transmitting section includes determining that the line is abnormal if the display states of the light transmitting section are inconsistent.

In an embodiment, the display state of the light transmitting section includes brightness.

In an embodiment, the extending direction of the first side and the second side is consistent with the extending direction of the data line, and the display mode of the display panel is in normally white mode. The method further includes inputting a voltage for displaying a black state to the data line and inputting a turn-on voltage to the gate line, determining the light transmitting section being lighted up as an abnormality mark, and determining the gate line corresponding to the abnormality mark as an open circuit.

In an embodiment, the extending direction of the first side and the second side is consistent with the extending direction of the data line, and the display mode of the display panel is in the normally black mode. The method further includes inputting a voltage for displaying a white state to the data line and inputting a turn-on voltage to the gate line, determining the light transmitting section being unlighted as an abnormality mark, and determining the gate line corresponding to the abnormality mark as an open circuit.

In an embodiment, inputting a voltage for displaying a white state to the data line includes inputting a voltage only to a data line in the dummy pixel region.

In an embodiment, an extending direction of the first side and the second side is consistent with an extending direction of the gate line, and a display mode of the display panel is a normally white mode. The method further includes inputting a voltage for displaying a black state to the data line and inputting a turn-on voltage to the gate line, determining the light transmitting section being lighted up as an abnormality mark, and determining the data line corresponding to the abnormality mark as an open circuit.

In an embodiment, an extending direction of the first side and the second side is consistent with the extending direction of the gate line, and the display mode of the display panel is in the normally black mode. The method further includes inputting a voltage for displaying a white state to the data line and inputting a turn-on voltage to the gate line, determining the light transmitting section being unlighted as an abnormality mark, and determining the data line corresponding to the abnormality mark as an open circuit.

In an embodiment, inputting the turn-on voltage to the gate line includes inputting a voltage only to a gate line in the dummy pixel region.

In an embodiment, if an abnormality mark occurs in the dummy pixel region on one side of opposite sides of the display region, determining that the line in the display region is abnormal In an embodiment, if abnormality marks occurs in the dummy pixel regions on both opposite sides of the display region, determining that the line in at least one of the dummy pixel region and a peripheral circuit is abnormal.

BRIEF DESCRIPTION OF THE DRAWINGS

To describe the technical solutions in the embodiments of the present disclosure more clearly, the accompanying drawings of the embodiments are briefly described below. It should be understood that the drawings described below refer only to some embodiments of the present disclosure, and not to restrict the present disclosure, wherein.

DETAILED DESCRIPTION

Figure 1:
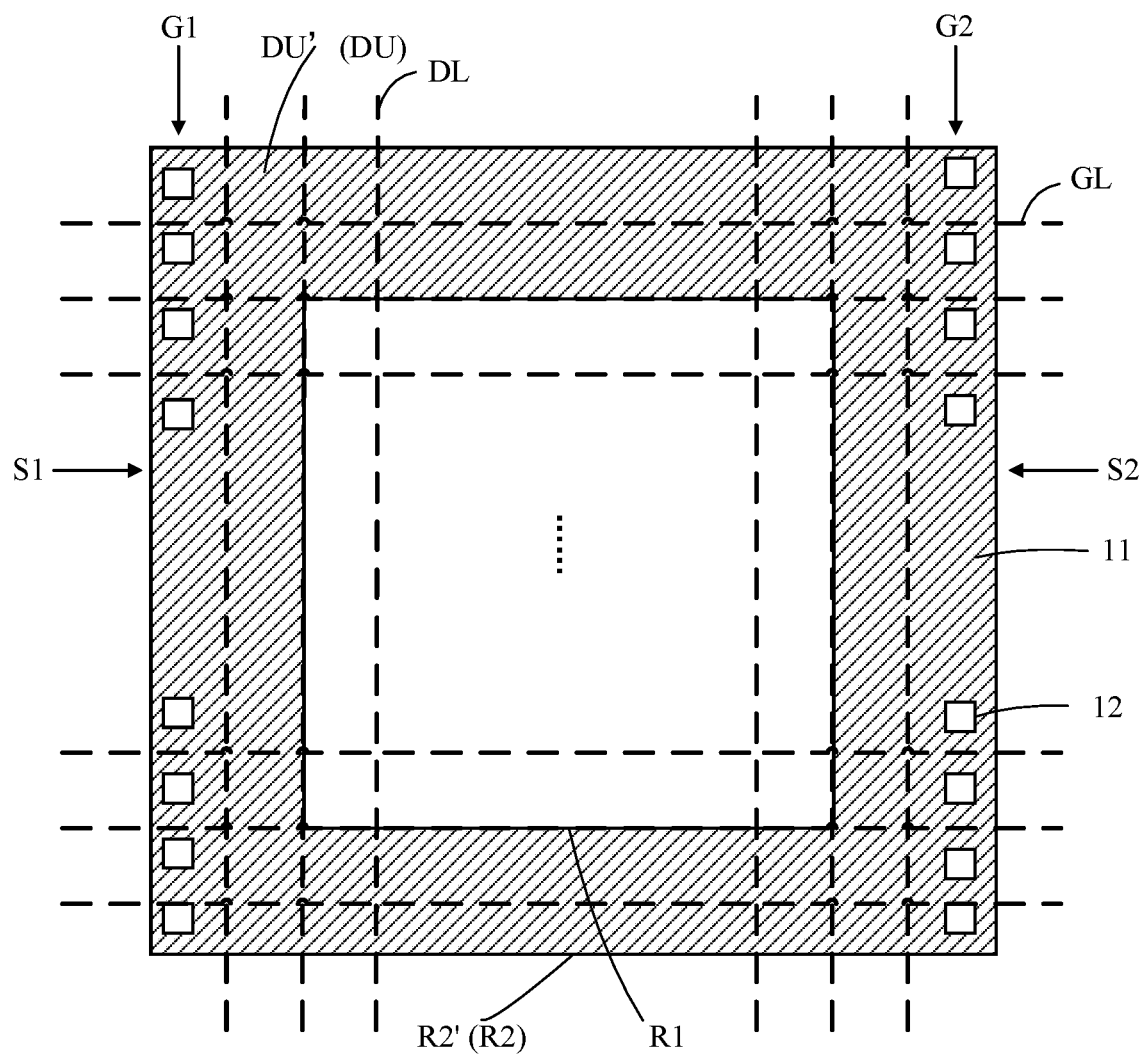
FIG. 1 is a schematic plan view of a color filter substrate according to an embodiment of the present disclosure.

In order to make the technical solutions and advantages of the embodiments of the present disclosure more comprehensible, the technical solutions of the embodiments of the present disclosure are clearly and completely described below with reference to the accompanying drawings. The described embodiments are only a part but not all of the embodiments of the present disclosure. Based on the described embodiments of the present disclosure, all other embodiments obtained by those skilled in the art without creative efforts shall also fall within the protection scope of the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. For purposes of the description hereinafter, the terms "upper", "lower", "right", "left", "vertical", "horizontal", "top", "bottom", and derivatives thereof shall relate to the disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

An embodiment of the present disclosure provides a color film substrate.

FIG. 1 is a schematic plan view of a color filter substrate according to an embodiment of the present disclosure. As shown in FIG. 1, the color filter substrate includes a display region R1 and a peripheral region R2' corresponding to a dummy pixel region R2 disposed around the display region. It can be understood that the display region may include a color filter layer. It can also be understood that the dummy pixel region herein is a region having a plurality of dummy pixel units of the array substrate, and the dummy pixel units of the dummy pixel region are defined by the gate lines GL and the data lines DL intersecting one other. A black matrix 11 of the color filter substrate has the light transmitting section 12 in a portion DU' of the peripheral region R2' corresponding to a dummy pixel unit DU the dummy pixel region R2. The light transmitting section includes a first set of light transmitting sections G1 and a second set of light transmitting sections G2. Wherein, each light transmitting section 12 of the first set of light transmitting sections G1 is formed in a portion DU' that extends along a first side S1 of the display region and corresponds to the dummy pixel unit. The second set of light transmitting sections G2 is formed in a portion DU' that that extends along a second side S2, opposite to the first side S1, of the display region and corresponds to the dummy pixel unit. It should be noted that although in FIG. 1, each light transmitting section in the first set of light transmitting sections is in the same column and each light transmitting section of the second set of light transmitting sections is in the same column is for an example. Each of the light transmitting sections may not be in the same column as long as it can satisfy that each light transmitting section in each set of light transmitting sections is provided along the extending direction of the corresponding side.

The light transmitting section 12 of the black matrix 11 may include openings formed in the black matrix.

With the color filter substrate according to the embodiment of the present disclosure, it is possible to solve the problem that the circuit anomaly detection of the display panel in the prior art takes time and effort.

Figure 2A:
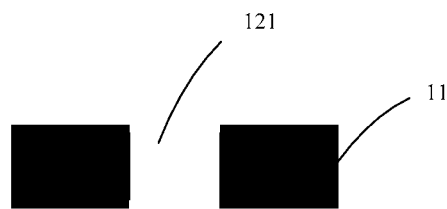
FIG. 2A is a partial cross-sectional schematic view of a color filter substrate according to an embodiment of the present disclosure.

FIG. 2A is a partial cross-sectional schematic view of a color filter substrate according to an embodiment of the present disclosure, showing a cross-section of a black matrix corresponding to one dummy pixel unit. FIG. 2A shows an example in which the light transmitting section of the black matrix 11 includes an opening 121 formed in the black matrix 11. For clarity of illustration, the black matrix is shown in black in FIG. 2A, and is not shown as hatched as in FIG. 1.

The light transmitting section 12 of the black matrix 11 may include an opening formed in the black matrix and a light shielding region within the opening.

Figure 2B:
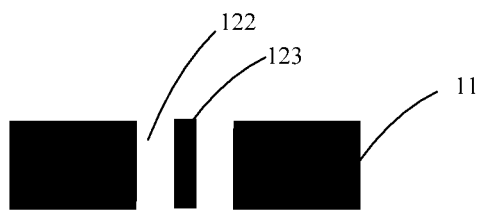
FIG. 2B is a partial cross-sectional schematic view of a color filter substrate according to an embodiment of the present disclosure.

FIG. 2B is a schematic partial cross-sectional view of a color filter substrate according to an embodiment of the present disclosure, which shows a cross section of a black matrix corresponding to one dummy pixel unit. FIG. 2B illustrates an example in which the light transmitting section of the black matrix includes an opening 122 formed in the black matrix and a light-shielding region 123 located in the opening 122. For clarity of illustration, the black matrix is shown in black in FIG. 2B, but not as hatched as in FIG. 1.

The shape of the mark may be set as needed, and the present disclosure does not limit it. For example, the mark may be a number, a letter, or the like. In an embodiment, for rapid identification, each of the first set of light transmitting sections and the second set of light transmitting sections may be set to have a sequentially arranged number of shapes.

Figure 3A:
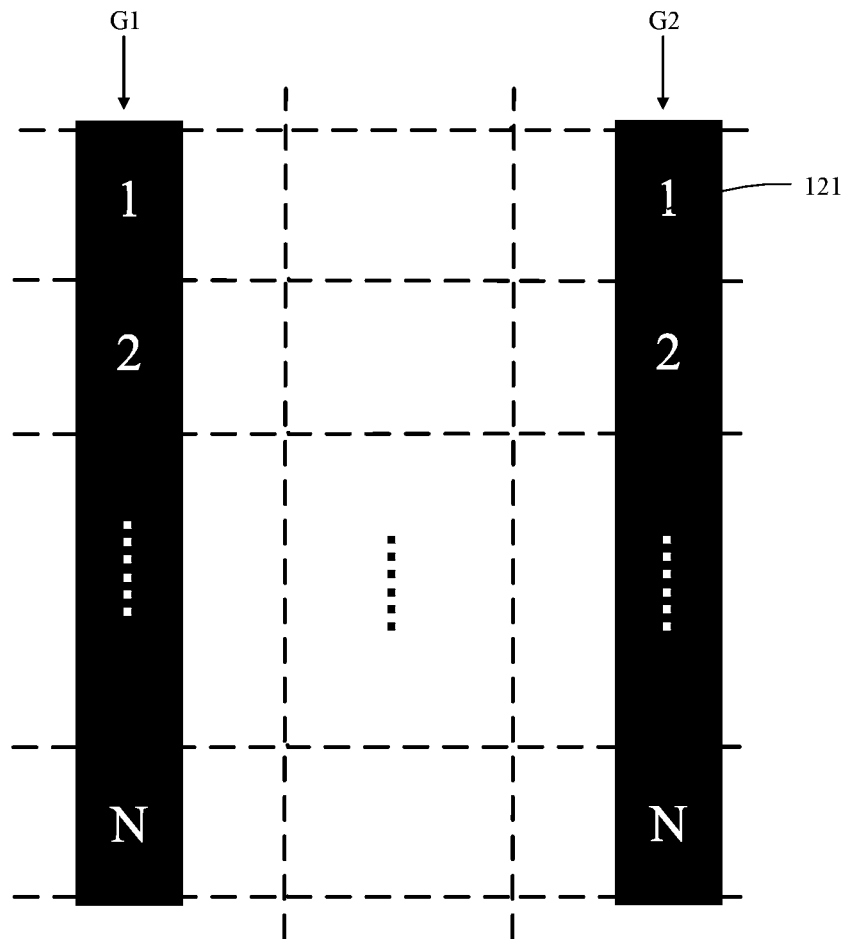
FIG. 3A is a schematic view of a color filter substrate according to an embodiment of the present disclosure.

FIG. 3A is a schematic view of a color filter substrate according to an embodiment of the present disclosure. FIG. 3A further shows the embodiment shown in FIG. 2A. For the sake of simplicity, the black matrixes on the other two sides of the color filter substrate adjacent to two sides where the light transmitting sections are provided are omitted. As shown in FIG. 3A, the openings 121 in each of the first set of transmitting portions G1 and the second set of transmitting portions G2 have a shape of numbers arranged in order.

Figure 3B:
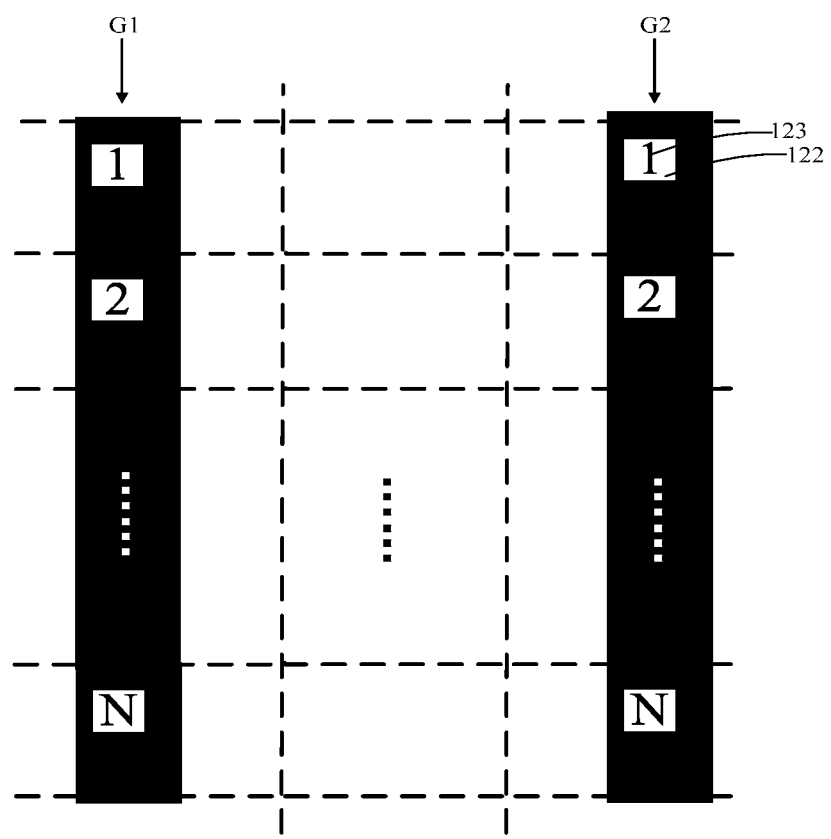
FIG. 3B is a schematic view of a color filter substrate according to an embodiment of the present disclosure.

FIG. 3B is a schematic view of a color filter substrate according to an embodiment of the present disclosure. FIG. 3B further shows the embodiment shown in FIG. 2B. For the sake of simplicity, the black matrixes on the other two sides of the color filter substrate adjacent to the two sides where the light transmitting sections are provided are omitted. As shown in FIG. 3B, the light shielding regions 123 of the openings 122 in each of the first set of light transmitting sections G1 and the second set of light transmitting sections G2 respectively have the shape of numbers arranged in order.

In an embodiment, the light transmitting section further includes a third set of light transmitting sections and a fourth set of light transmitting sections.

Figure 4:
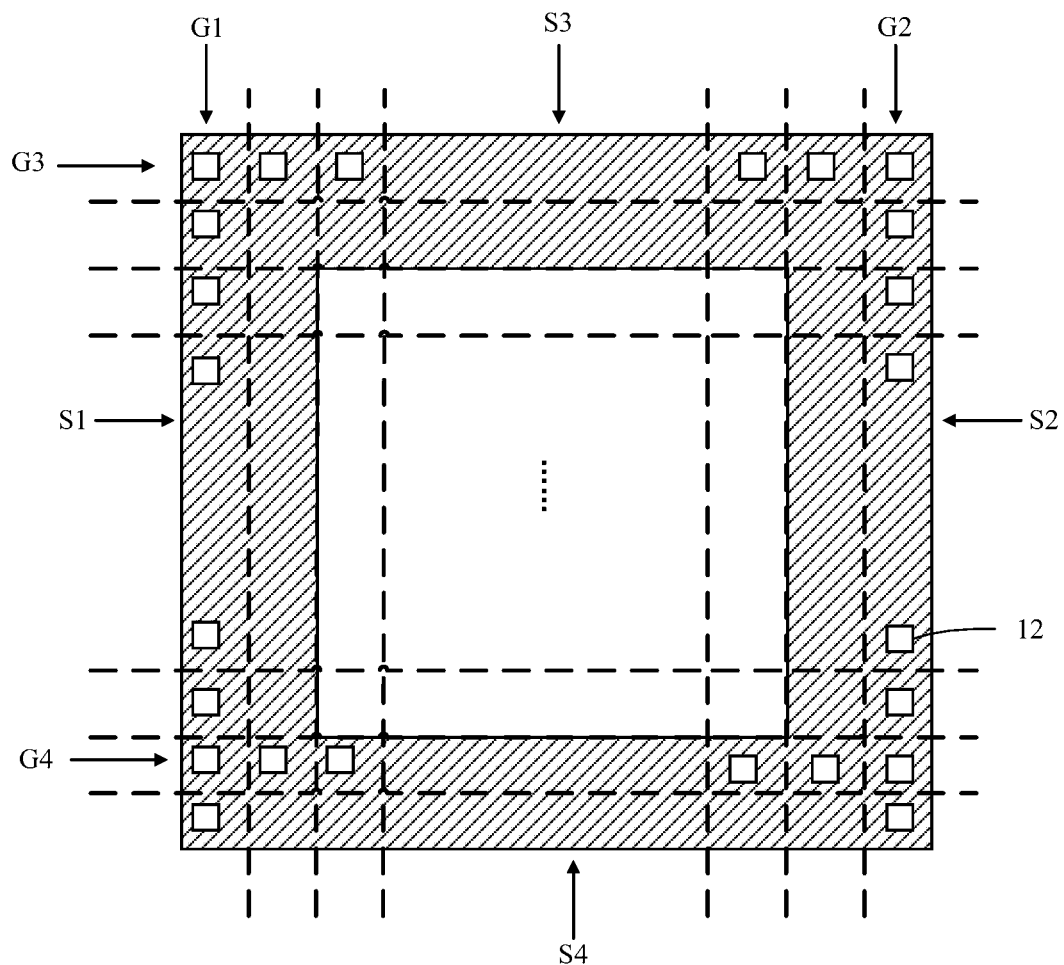
FIG. 4 is a schematic view of a color filter substrate according to an embodiment of the present disclosure.

FIG. 4 is a schematic view of a color filter substrate according to an embodiment of the present disclosure. In addition to the structure shown in FIG. 1, the color filter substrate shown in FIG. 4 further includes a third set of light transmitting sections and a fourth set of light transmitting sections. As shown in FIG. 4, each of the light transmitting sections of the third set of light transmitting sections G3 is formed in a portion that extends along a third side S3 of the display region adjacent to the first side S1 and corresponds to the dummy pixel unit. Each light transmitting section in the fourth set of light transmitting sections G4 is formed in a portion that extends along a fourth side S4, opposite to the third side S3, of the display region and corresponds to the dummy pixel unit. It should be noted that although in FIG. 4, the light transmitting sections in the third set of light transmitting sections are located in the same row and the respective light transmitting sections in the fourth set of light transmitting sections are located in the same row are exemplary. The light transmitting sections in each set may be not in the same row, as long as the light transmitting sections in each set of the light transmitting sections can be provided along the extending direction of the respective sides.

The embodiments of the present disclosure also provide a display panel.

Figure 5:
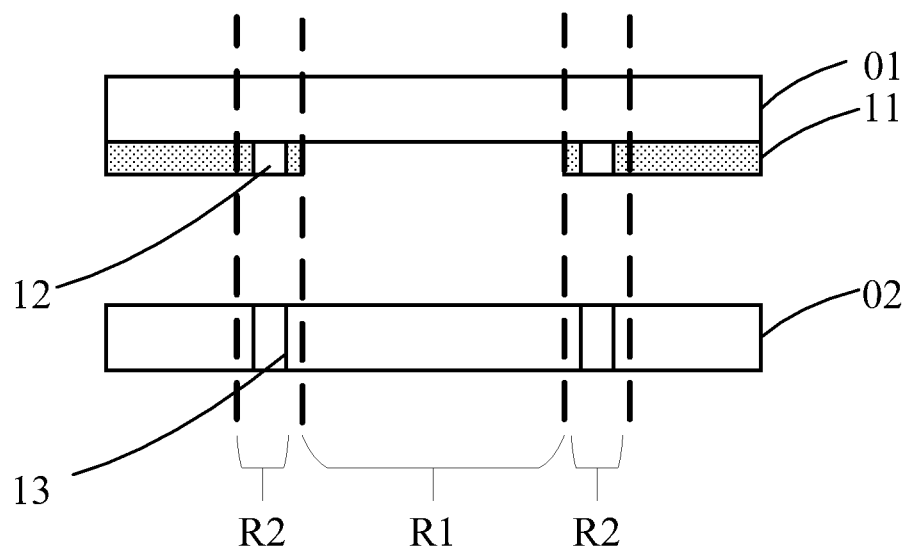
FIG. 5 is a schematic view of a display panel according to an embodiment of the present disclosure.

FIG. 5 is a schematic view of a display panel according to an embodiment of the present disclosure. FIG. 5 is a schematic view of a display panel according to an embodiment of the present disclosure. The display panel of FIG. 5 includes the color filter substrate 01 and the array substrate 02 disposed opposite to the color filter substrate as described above. As shown in FIG. 5, in the display panel provided by the embodiments of the present disclosure, the light transmitting section 12 of the color film substrate 01 and the light transmitting region 13 in the dummy pixel region R2 of the array substrate are aligned with each other, so that light from the light-transmitting region 13 can pass through the black matrix 11. For example, when using a light transmitting conductive material such as ITO as a pixel electrode and an opaque metal such as Al or Cu as a gate metal layer, a region where the gate electrode is located is an opaque region of the array substrate, and the remaining region is an array substrate translucent area.

Figure 6:
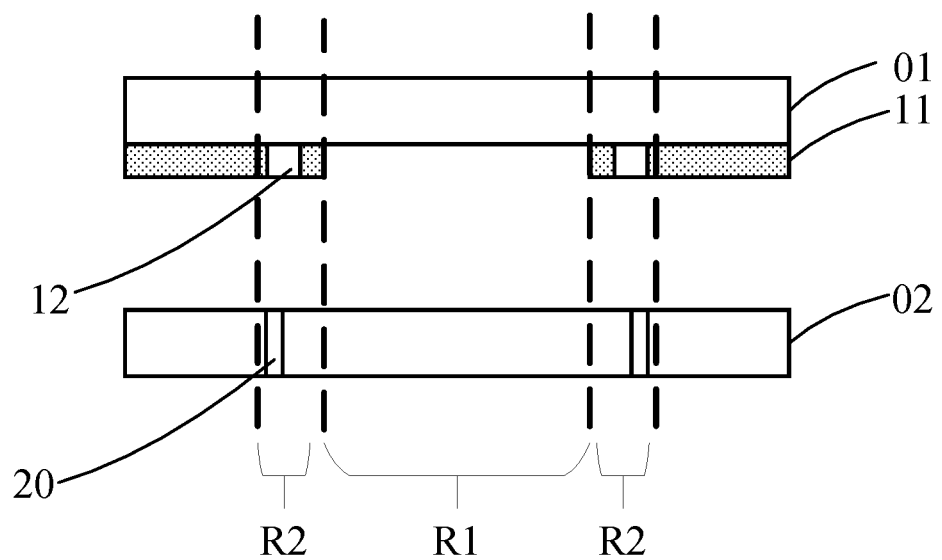
FIG. 6 is a schematic view of a display panel according to an embodiment of the present disclosure.
Figures 11, 12:
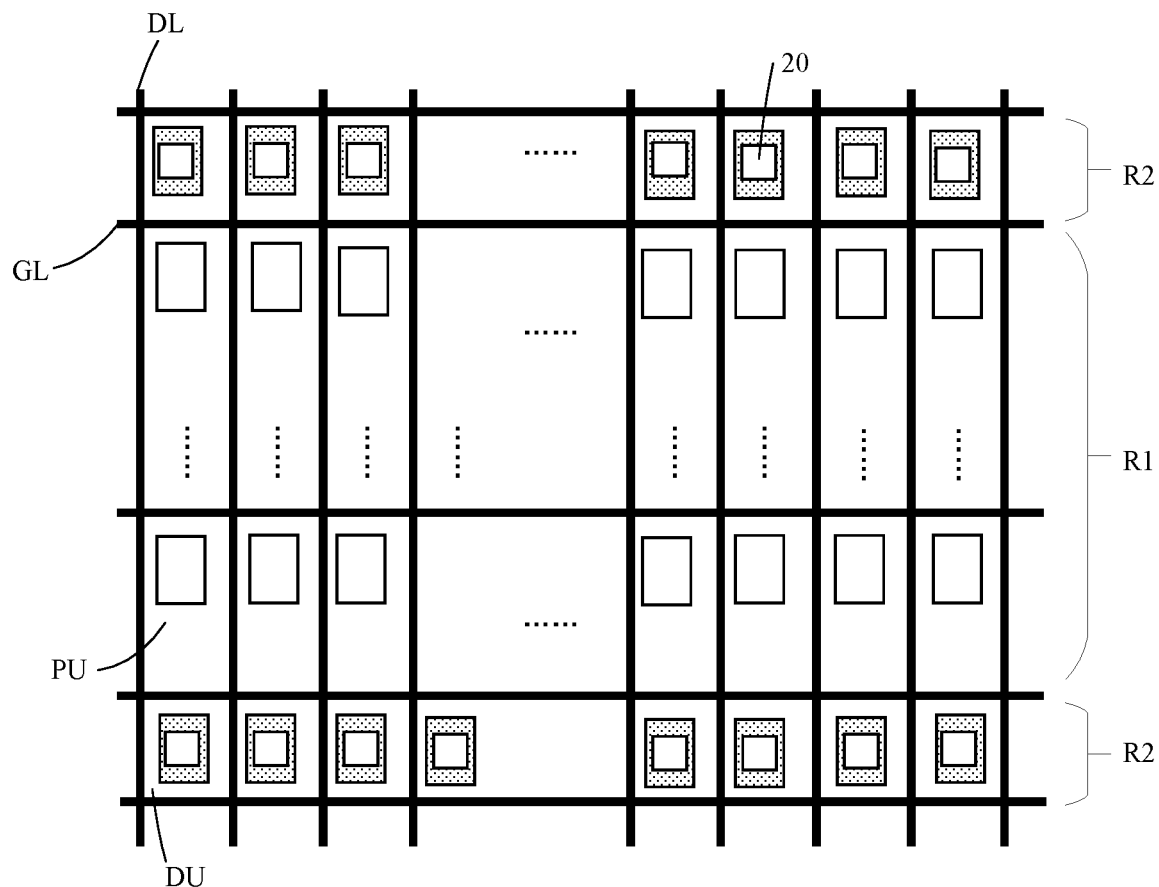
FIG. 11 is a schematic view of a array substrate of a display panel according to an embodiment of the present disclosure.
FIG. 12 is a flowchart of a method for detecting a display panel according to an embodiment of the present disclosure.

FIG. 6 is a schematic view of a display panel according to an embodiment of the present disclosure. The display panel of FIG. 6 includes the color film substrate 01 and the array substrate 02 disposed opposite to the color film substrate as described above. As shown in FIG. 11, the light transmitting section 12 of the color filter substrate 01 is aligned with the mark 20 in the array substrate 02 so that the light from the mark 20 can pass through the black matrix 11.

Figure 7:
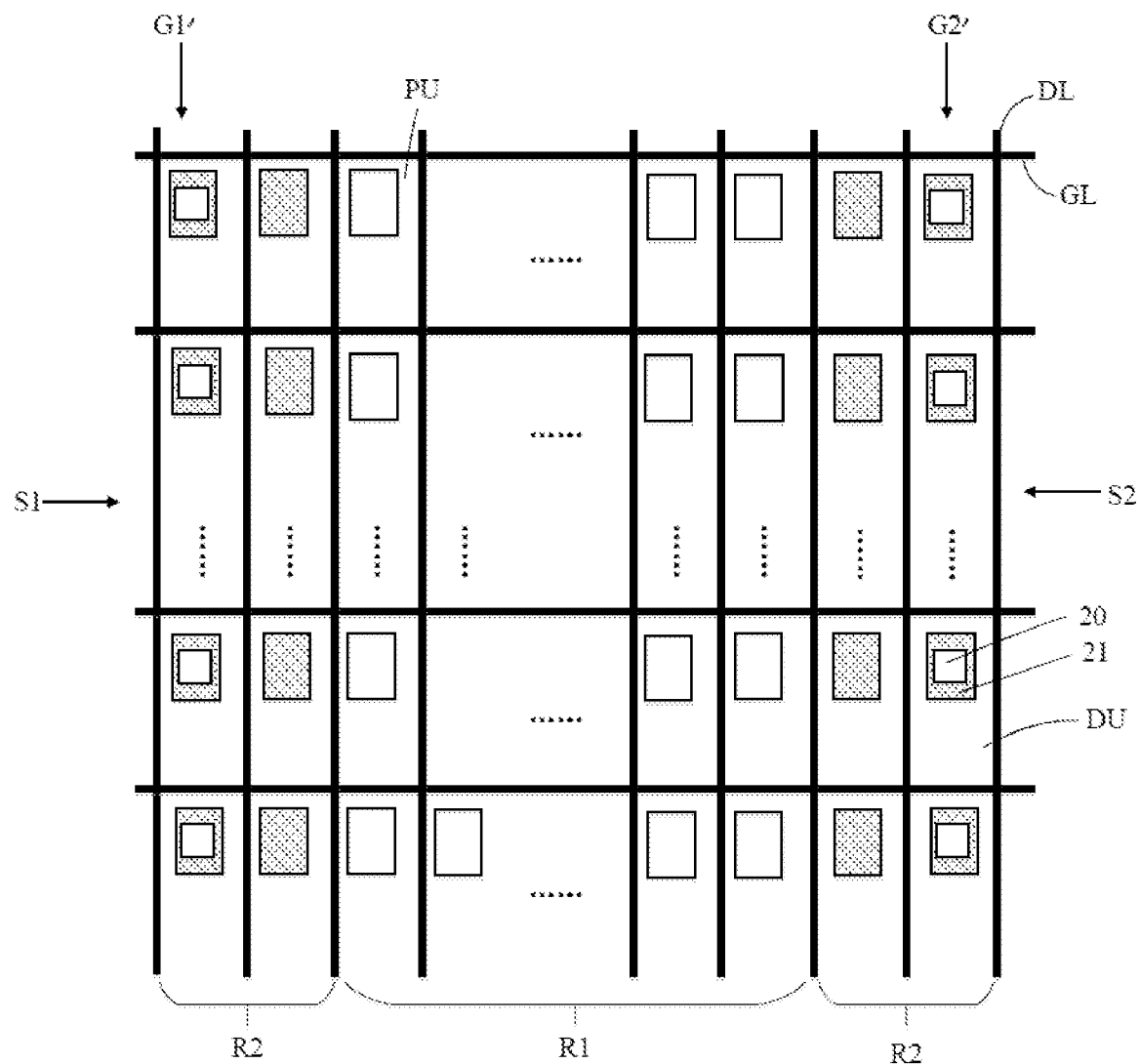
FIG. 7 is a further schematic view of the array substrate of the display panel of FIG. 6.

FIG. 7 is a further schematic view of the array substrate of the display panel of FIG. 6. As shown in FIG. 7, an array substrate of a display panel according to an embodiment of the present disclosure includes a display region R1 and a dummy pixel region R2 disposed around the display region R1. The display region R1 has a plurality of pixel units PU defined by the gate lines GL and the data lines DL intersecting one another, and the dummy pixel region R2 has a plurality of dummy pixel units DU defined by the gate lines GL and the data lines DL intersecting one another. The dummy pixel region R2 has a mark 20 located on the dummy pixel unit DU, and the mark includes a first set of marks G1' and a second set of marks G2'. Each mark in the first set of marks is formed in a dummy pixel units extending along a first side of the display region. Each mark in the second set of marks is formed in the dummy pixel units extending along on a second side, opposite to the first side, of the display region.

It should be noted that although in FIG. 7, marks in the first set of marks are in the same column and marks in the second set of marks are in the same column are exemplary. Marks in each set of marks may not be in the same column, as long as satisfying that marks in each set of marks can be set along the extending direction of the corresponding side. For the sake of simplicity, FIG. 7 only shows the dummy pixel regions located on the left and right sides of the display region, and the dummy pixel regions located on the upper and lower sides of the display region are omitted.

In an embodiment, the extending direction of the first side S1 and the second side S2 may consistent with one of an extending direction of the gate line GL and the extending direction of the data line DL. The light transmittance of the mark may be greater than that of other portions of the dummy pixel unit, and thus may exhibit different display brightness when being lit.

In an embodiment, the mark 20 can be formed in the gate electrode metal layer 21 of the thin film transistor of the array substrate, considering that the gate metal layer of the thin film transistor of the array substrate can adopt opaque metal materials such as Cu, Al and process accuracy.

The mark may include an opening formed in the gate metal layer.

Figure 8A:
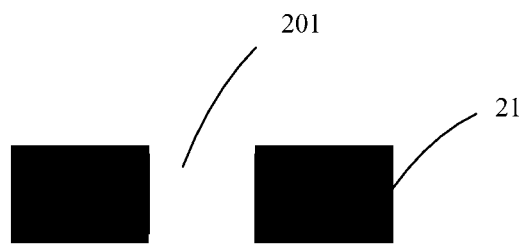
FIG. 8A is a partial cross-sectional schematic view of an array substrate of a display panel according to an embodiment of the present disclosure.

FIG. 8A is a partial cross-sectional schematic view of an array substrate of a display panel according to an embodiment of the present disclosure. FIG. 8A shows an example that the mark 20 is formed in the gate metal layer 21 of the thin film transistor of the array substrate, and shows a section of the gate metal layer 21 corresponding to one dummy pixel unit. The embodiment of FIG. 8A takes the mark 20 including an opening 201 formed in the black matrix 11 as an example. For clarity of illustration, the gate metal layer 21 is shown in black in FIG. 8A, and is not shown as hatched as in FIG. 5.

The mark 20 may include an opening formed in the gate metal layer and a light shielding portion in the opening.

Figure 8B:
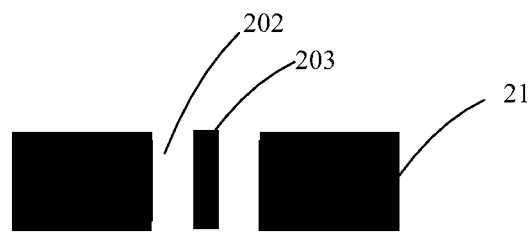
FIG. 8B is a partial cross-sectional schematic view of an array substrate of a display panel according to an embodiment of the present disclosure.

FIG. 8B is a partial cross-sectional schematic view of an array substrate of a display panel according to an embodiment of the present disclosure. FIG. 8B shows an example in which a mark 20 is formed in the gate metal layer 21 of the thin film transistor of the array substrate, and shows a section of the gate metal layer 21 corresponding to one dummy pixel unit. In FIG. 8B, an example in which the mark 20 includes an opening 202 formed in the gate metal layer 21 and a light shielding portion 203 located in the opening is exemplified. For clarity of illustration, the gate metal layer 21 in FIG. 8B is shown in black and is not shown as hatched as in FIG. 7.

The shape of the mark may be set as needed, and the present disclosure does not limit it. For example, the mark may be a number, a letter, or the like. In an embodiment, for rapid identification, each light transmitting section of the first set of light transmitting sections and the second set of light transmitting sections may be set to have a shape of numbers arranged in sequence.

Figure 9A:
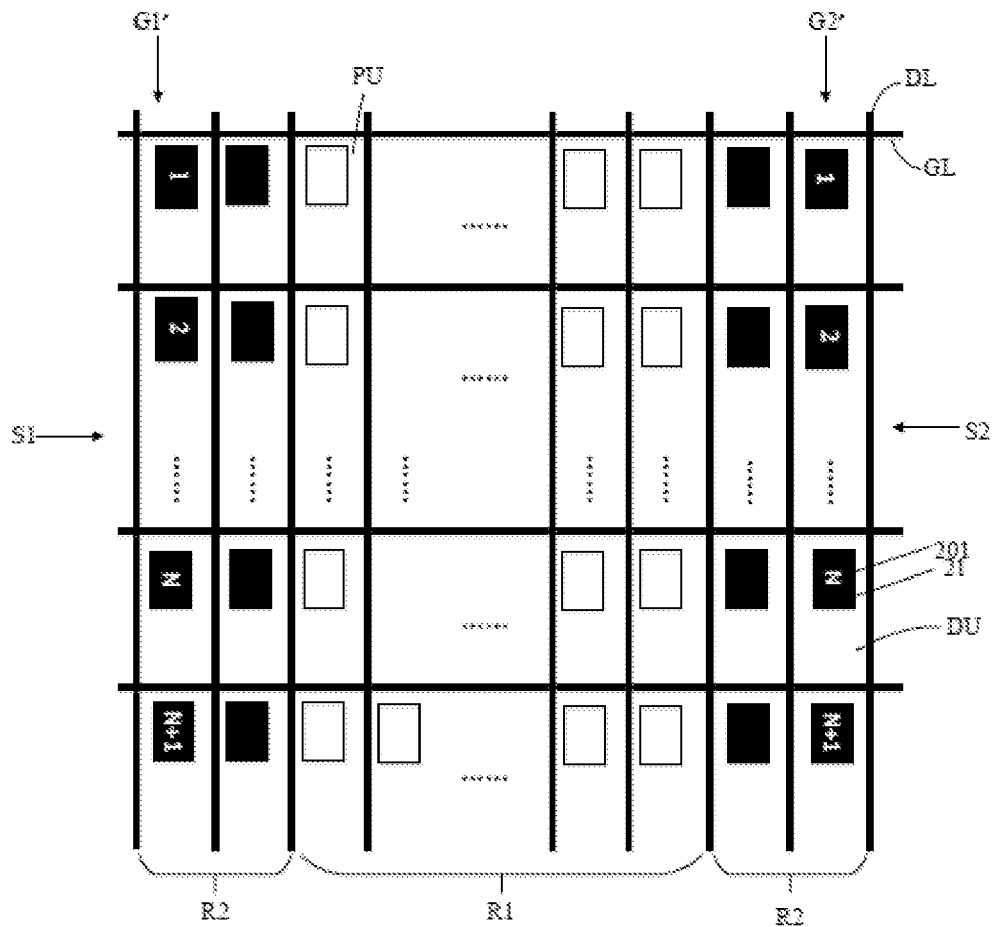
FIG. 9A is a schematic view of an array substrate of a display panel according to an embodiment of the present disclosure.

FIG. 9A is a schematic view of an array substrate of a display panel according to an embodiment of the present disclosure. FIG. 9A further shows the embodiment shown in FIG. 8A. As shown in FIG. 9A, the openings 201 in each of the first set of marks G1' and the second set of marks G2' have a shape of numbers arranged in order.

Figure 9B:
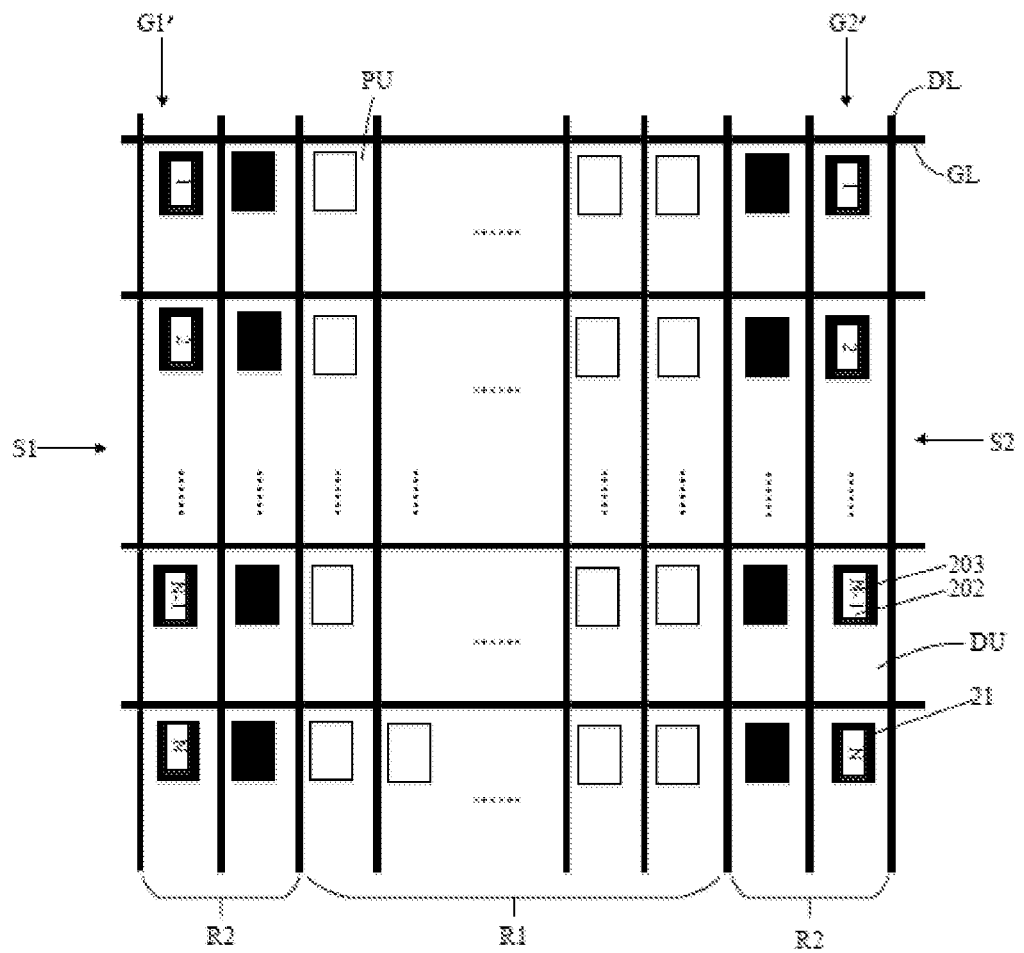
FIG. 9B is a schematic view of an array substrate of a display panel according to an embodiment of the present disclosure.

FIG. 9B is a schematic view of an array substrate of a display panel according to an embodiment of the present disclosure. FIG. 9B further shows the embodiment shown in FIG. 8B. As shown in FIG. 9B, the light shielding portion 203 of the openings 202 in each of the first set of marks G1' and the second set of marks G2' have the shape of numbers arranged in order.

Figure 10:
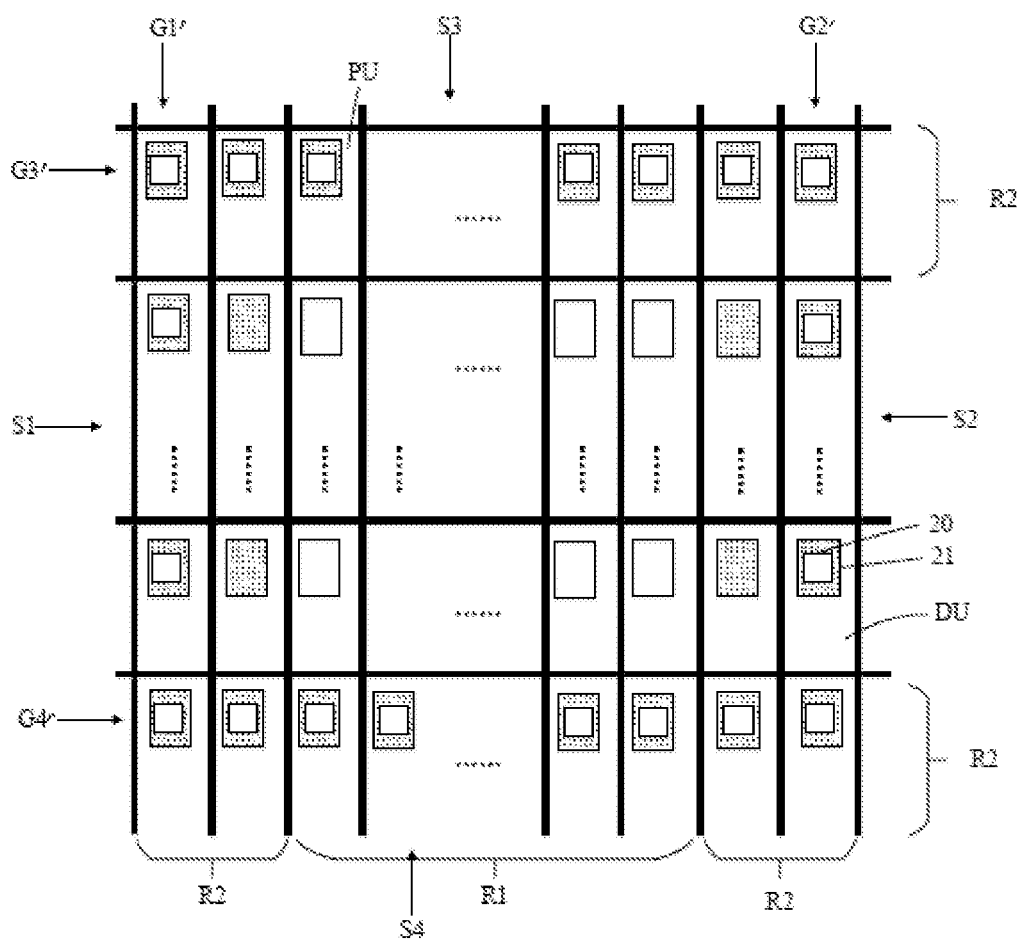
FIG. 10 is a schematic view of an array substrate of a display panel according to an embodiment of the present disclosure.

FIG. 10 is a schematic view of an array substrate of a display panel according to an embodiment of the present disclosure. In addition to the structure illustrated in FIG. 7, the array substrate illustrated in FIG. 10 further includes a third set of marks G3' and a fourth set of marks G4'. As shown in FIG. 10, each mark in the third set of marks G3' is formed in the dummy pixel unit extending along a third side S3 of the display region adjacent to the first side S1.

Each of the marks of the fourth set of marks G4' is formed in the dummy pixel unit extending along a fourth side S4, opposite to the third side S3, of the display region. It should be noted that, although FIG. 10 shows that the marks in the third set of marks are on the same row and the marks in the fourth set of marks are in the same row, marks in each set of marks may not be on the same row as long as satisfying marks in each set of marks may be provided along the extending direction of the corresponding side.

FIG. 11 is a schematic view of an array substrate of a display panel according to an embodiment of the present disclosure. For the sake of simplicity, only the dummy pixel regions located on the upper and lower sides of the display region are shown in FIG. 11, and the dummy pixel regions located on the left and right sides of the display region are omitted.

In the embodiment of FIG. 11, the extending direction of the marks coincides with the extending direction of the gate line GL, and the length of the dummy pixel unit DU in the extending direction of the data line DL is smaller than the extending direction of the pixel unit PU in the extending direction of the data line DL. With this length setting, space can be saved.

The embodiments of the present disclosure also provide a method for detecting a display panel. The display panel includes the display panel as described above. FIG. 12 is a method for detecting a display panel according to an embodiment of the present disclosure. As shown in FIG. 12, the method for detecting a display panel includes:

S1: detecting a display state of the light transmitting section of the color filter substrate.

S3: determining whether the line is abnormal according to the display state of the light transmitting section.

Figure 13:
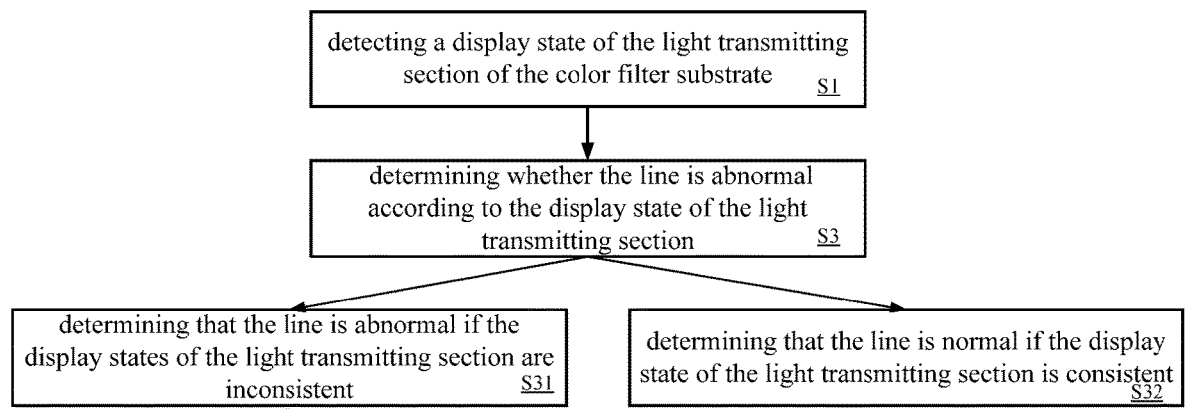
FIG. 13 is a flowchart of a method for detecting a display panel according to an embodiment of the present disclosure.

FIG. 13 is a flowchart of a method for detecting a display panel according to an embodiment of the present disclosure. FIG. 13 further shows the method for detecting a display panel shown in FIG. 12. In the embodiment of FIG. 13, determining whether the line is abnormal according to the display state of the light transmitting section includes:

S31: determining that the line is abnormal if the display state of the light transmitting section is inconsistent.

S32: determining that the line is normal if the display state of the light transmitting section is consistent.

In an embodiment, the display state of the light transmitting section includes brightness of the dummy display unit.

Figure 14:
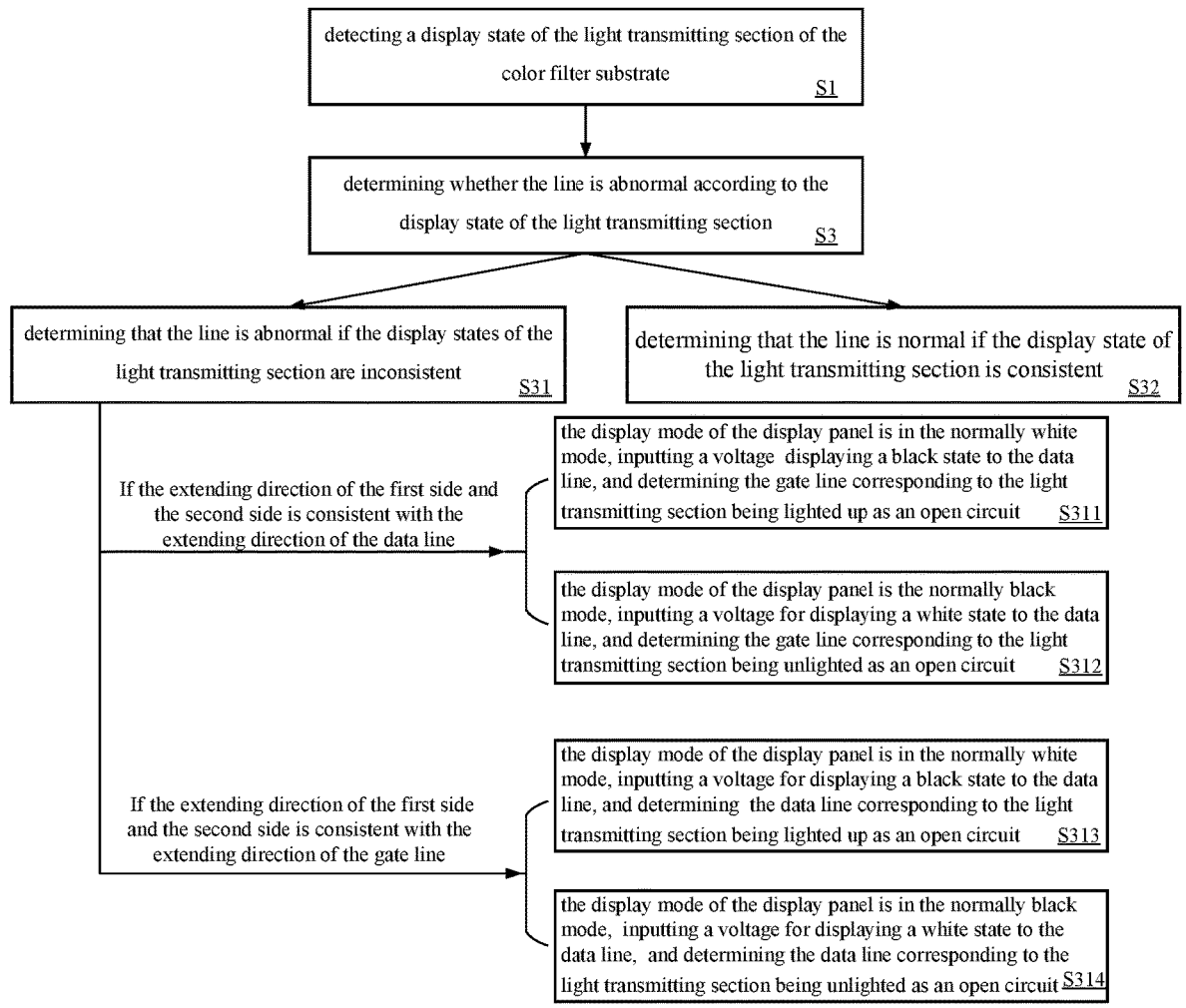
FIG. 14 is a flowchart of a method for detecting a display panel according to an embodiment of the present disclosure.

FIG. 14 is a flowchart of a method for detecting a display panel according to an embodiment of the present disclosure. FIG. 14 further shows the method for detecting a display panel shown in FIG. 13. In the embodiment of FIG. 14, the method for detecting a display panel further includes the following steps:

S311: if the extending direction of the first side and the second side is consistent with the extending direction of the gate line, and the display mode of the display panel is in the normally white mode, the method further includes inputting a voltage (for example, L0) displaying a black state to the data line and inputting an on-voltage to the gate line, determining the light transmitting section being lighted up as an abnormality mark, and determining the gate line corresponding to the abnormality mark as an open circuit.

Specifically, in this case, a turn-on voltage is input to the gate, and the L0 voltage may be input to the data line through the data IC. The dummy pixel region where no line abnormality appears is in a black state, and the mark is invisible. When an open circuit occurs, the L0 voltage cannot be input to the dummy pixel region corresponding to the disconnected portion. Thus, the abnormal dummy pixel region is lit to be in a white state. At this time, the display state of the abnormal dummy pixel region can be seen through the light transmitting portion. Therefore, the gate line in the display region corresponding to the light transmitting section can be determined to be open, and the gate line corresponding to the unlighted light transmitting section can be determined as no line abnormality.

S312: For the case where the extending directions of the first side and the second side are consistent with the extending direction of the data line and the display mode of the display panel is the normally black mode, the method further includes inputting a voltage (for example, L255) for displaying a white state to the data line and inputting a turn-on voltage to the gate line, determining the light transmitting section being unlighted as an abnormality mark, and determining the gate line corresponding to the abnormality mark as an open circuit. In an embodiment, in order to visually distinguish between the abnormal line and the normal line, inputting a voltage for displaying the white state to the data line includes inputting a voltage only to the data line in the dummy pixel region. For example, as shown in FIG. 15A to be described later, the data lines of the dummy pixel region may be connected to the additional pads 50 to provide voltages independently from a data IC.

S313: If the extending direction of the first side and the second side is consistent with the extending direction of the gate line, and the display mode of the display panel is in the normally white mode, the method further includes inputting a voltage (For example, LO) for displaying a black state to the data line and inputting a turn-on voltage to the gate line, determining the light transmitting section being lighted up as an abnormality mark, and determining the data line corresponding to the abnormality mark as an open circuit.

S314: If an extending direction of the first side and the second side is consistent with the extending direction of the gate line, and the display mode of the display panel is in the normally black mode, the method further includes inputting a voltage (For example, the L255) for displaying a white state to the data line and inputting a turn-on voltage to the gate line, determining the light transmitting section being unlighted as an abnormality mark, and determining the data line corresponding to the abnormality mark as an open circuit. In an embodiment, in order to visually distinguish between the abnormal line and the normal line, inputting the turn-on voltage to the gate line includes only inputting a voltage to the gate line in the dummy pixel region. For example, as shown in FIG. 15B described later, the gate line of the dummy pixel region may be connected to an additional pad 50' to provide a voltage independently from the gate IC.

Figure 15A:
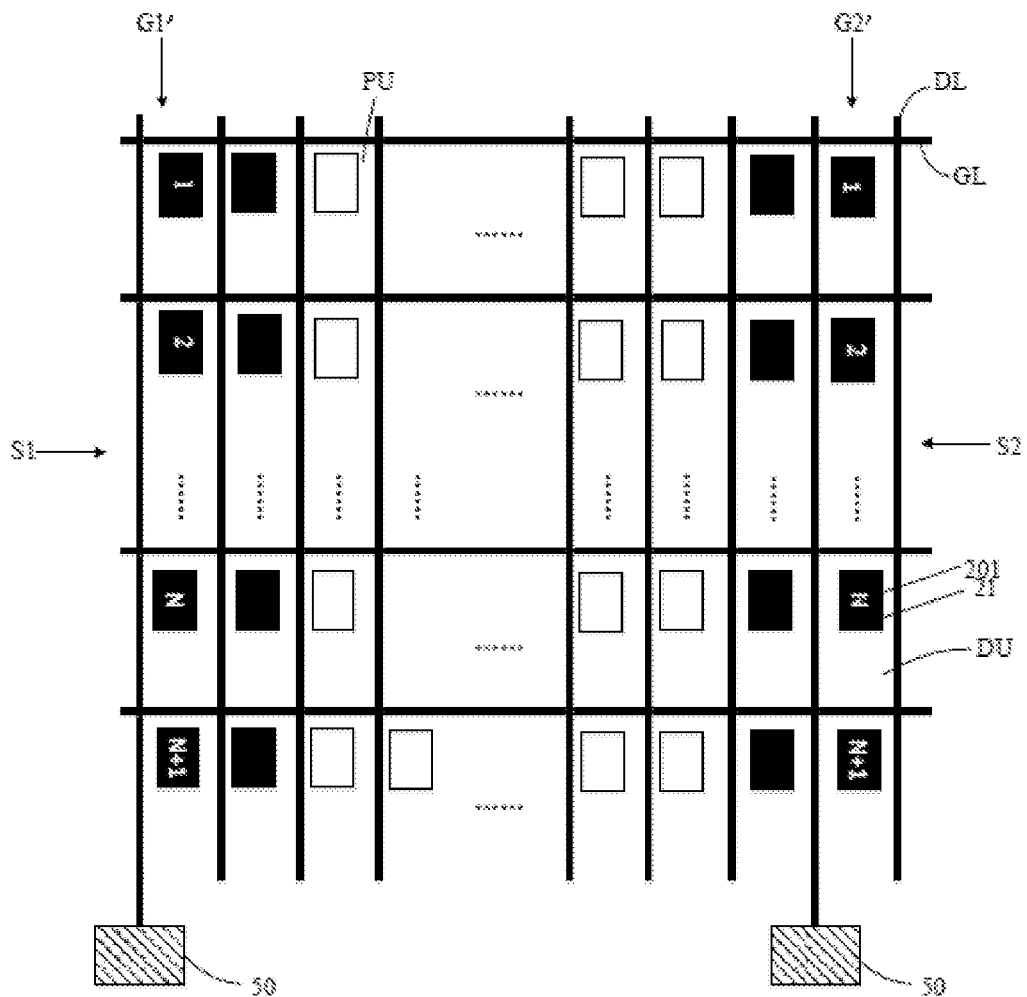
FIG. 15A is a schematic view of an array substrate provided with a pad of a display panel according to an embodiment of the present disclosure.
Figure 15B:
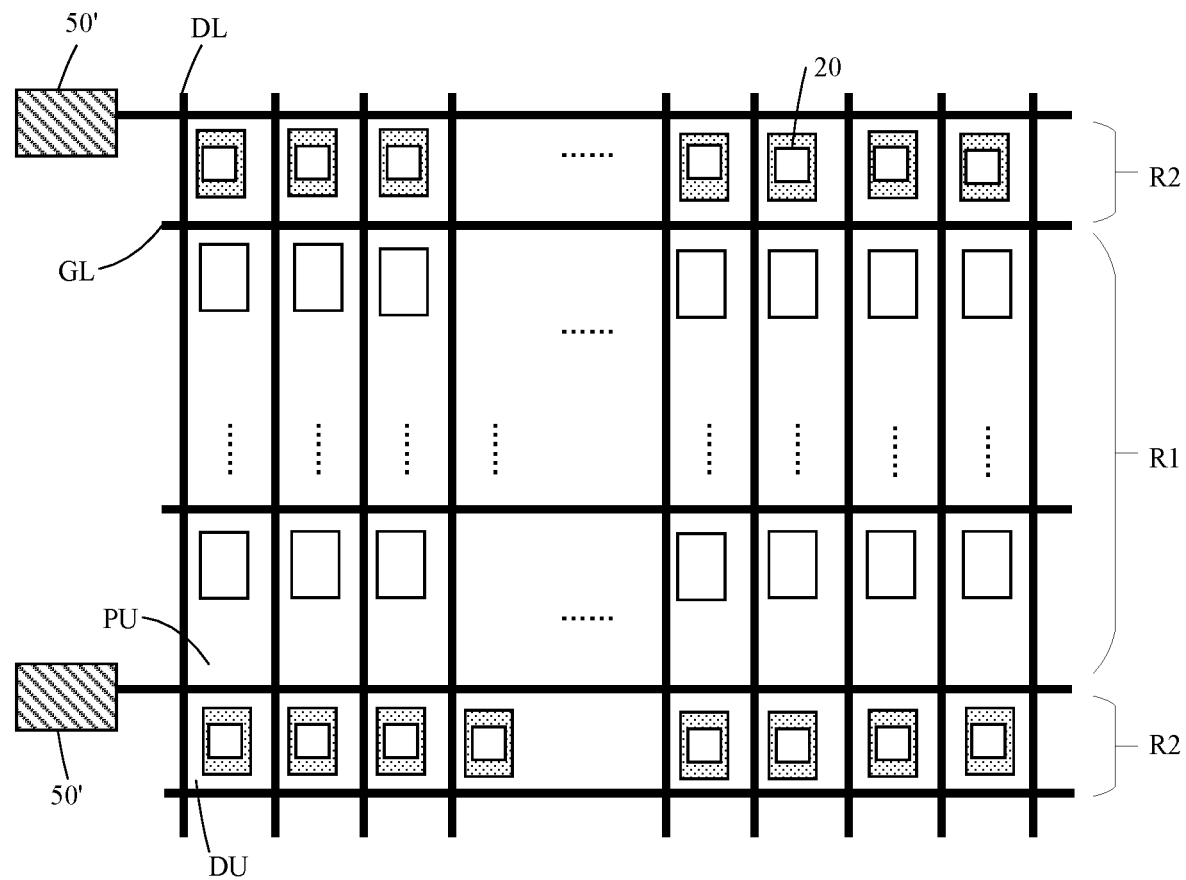
FIG. 15B is a schematic view of an array substrate provided with a pad of a display panel according to an embodiment of the present disclosure.

FIGS. 15A and 15B are schematic views of an array substrate with pads of a display panel according to an embodiment of the present disclosure.

For the case where the extending direction of the first side and the second side coincides with the extending direction of the data line and the display mode of the display panel is the normally black mode, as shown in FIG. 15A, the data lines of the dummy pixel region can be connected to pad 50. In this case, after the gate is turned on and the voltage for displaying the white state is input to the data line, the dummy pixel region where no abnormality occurs is in a white state and the corresponding mark is visible. When an open circuit occurs, the dummy pixel corresponding to the disconnection occurs will be charged with L255 voltage through the pad, the abnormal dummy pixel region will be black, and the abnormal mark will not be visible. Therefore, the gate line corresponding to the unlighted mark can be determined to be open.

For the case where the extending directions of the first side and the second side coincide with the extending direction of the gate line and the display mode of the display panel is the normally black mode, as shown in FIG. 15B, the gate line of the dummy pixel region may be connected to the pad 50'. In this case, after the gate is turned on and the voltage for displaying the white state is input to the data line, the dummy pixel region where no circuit abnormality appears is in a white state, the corresponding mark is visible. If an open circuit occurs, the dummy circuit corresponding to the open circuit will be charged with the L255 voltage through the pad. The abnormal dummy pixel region is black and the abnormal mark is not visible. Therefore, the data line corresponding to the unlighted mark can be determined to be an open circuit.

Through the embodiments of the present disclosure, a solution for quickly detecting a display panel can be provided. In the embodiment of the present disclosure, if an abnormality mark occurs in a dummy pixel region on one side of the opposite sides of the display region, the line in the display region will be determined as being abnormal. If abnormality marks occur in the both dummy pixel regions on the opposite sides of the display region, the line of at least one of the dummy pixel region and the peripheral circuit is determined to be abnormal.

Having described certain specific embodiments, these embodiments have been presented by way of example only, and are not intended to limit the scope of the present disclosure. Indeed, the novel embodiments described herein may be embodied in various other forms, furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A color filter substrate comprising a display region and a peripheral region corresponding to a dummy pixel region around the display region, wherein a black matrix of the color filter substrate comprises a light transmitting section in a portion of the peripheral region corresponding to a dummy pixel unit, and wherein the light transmitting section comprises a first set of light transmitting sections and a second set of light transmitting sections,
   wherein, each of the first set of light transmitting sections is in a portion that extends along a first side of the display region and corresponds to the dummy pixel unit, and each of the second set of light transmitting sections is in a portion that that extends along a second side, opposite to the first side, of the display region and corresponds to the dummy pixel unit,
   wherein the light transmitting section comprises an opening in the black matrix and a light-shielding region in the opening, and
   wherein the light-shielding regions of the openings in each of the first set of light transmitting sections and the second set of light transmitting sections respectively have a sequentially arranged shape of numbers.

2. The color filter substrate according to claim 1, wherein the light transmitting section further comprises a third set of light transmitting sections and a fourth set of light transmitting sections,
   wherein each of the third set of light transmitting sections is in a portion that extends along a third side of the display region adjacent to the first side and corresponds to the dummy pixel unit, and
   wherein each of the fourth set of light transmitting sections is in a portion of that extends along a fourth side, opposite to the third side, of the display region and corresponds to the dummy pixel unit.

3. A display panel comprising the color filter substrate according to claim 1 and an array substrate arranged opposite to the color filter substrate.

4. The display panel according to claim 3, wherein the light transmitting section of the color filter substrate and a light-transmitting region in the dummy pixel region of the array substrate are aligned such that light from the light-transmitting region can pass through the black matrix of the color filter substrate.

5. The display panel according to claim 3, wherein the array substrate comprises a display region and a dummy pixel region around the display region, the display region having a plurality of pixel units defined by gate lines and data lines intersecting one another, the dummy pixel region having a plurality of dummy pixel units defined by the gate lines and the data lines intersecting one another,
   wherein the dummy pixel region has marks located in the dummy pixel unit, and the marks include a first set of marks and a second set of marks,
   wherein, each mark in the first set of marks is in the dummy pixel unit extending along a first side of the display region, and each mark in the second set of marks is in the dummy pixel unit extending along on a second side, opposite to the first side, of the display region, and
   wherein, the light transmitting section of the color filter substrate is aligned with the mark in the array substrate, so that the light from the mark can transmit through the black matrix.

6. The display panel of claim 5, wherein the light transmittance of the mark is greater than the light transmittance of other portions of the dummy pixel unit, and wherein the mark is in a gate metal layer of a thin film transistor of the array substrate.

7. The display panel of claim 6, wherein the mark comprises an opening formed in the gate metal layer, or wherein the mark comprises an opening in the gate metal layer and a light shielding portion located in the opening.

8. The display panel of claim 7, wherein the openings of each of the first set of marks and the second set of marks respectively have a shape of numbers arranged in sequence, or the light shielding portions of each of the first set of marks and the second set of marks respectively have a shape of numbers arranged in sequence.

9. The display panel according to claim 5, wherein an extending direction of the mark is consistent with an extending direction of the gate line, and wherein a length of the dummy pixel unit in an extending direction of the data line is smaller than a length of the pixel unit in an extending direction of the data line.

10. The display panel according to claim 5, wherein the mark further comprises a third set of marks and a fourth set of marks,
   wherein, each mark in the third set of marks is in the dummy pixel unit extending along a third side of the display region adjacent to the first side,
   wherein each of the marks of the fourth set of marks is in the dummy pixel unit extending along a fourth side, opposite to the third side, of the display region, and wherein an extension direction of the third side and the fourth side is consistent with the other one of the extension direction of the gate line and the extension direction of the data line.

11. The display panel according to claim 5, wherein an extending direction of the first side and the second side is consistent with one of an extending direction of a gate line and an extending direction of a data line.

12. A method for detecting a display panel, wherein the display panel comprises the display panel according to claim 3, and the method for detecting the display panel comprises:
   detecting a display state of the light transmitting section of the color filter substrate; and
   determining whether a line is abnormal according to the display state of the light transmitting section.

13. The method for detecting a display panel according to claim 12, wherein determining whether the line is abnormal according to the display state of the light transmitting section comprises determining that the line is abnormal if the display states of the light transmitting section are inconsistent, wherein the display state of the light transmitting section comprises brightness.

14. The method for detecting a display panel according to claim 13, wherein the extending direction of the first side and the second side is consistent with the extending direction of a data line, and wherein:
   if a display mode of the display panel is in a normally white mode, the method further comprises inputting a voltage for displaying a black state to the data line and inputting a turn-on voltage to the gate line, determining the light transmitting section being lighted up as an abnormality mark, and determining the gate line corresponding to the abnormality mark as an open circuit, or
   if a display mode of the display panel is in a normally black mode, the method further comprises inputting a voltage for displaying a white state to the data line and inputting a turn-on voltage to the gate line, determining the light transmitting section being unlighted as an abnormality mark, and determining the gate line corresponding to the abnormality mark as an open circuit.

15. The method for detecting a display panel according to claim 14, wherein inputting a voltage for displaying a white state to the data line comprises inputting a voltage only to the data line in the dummy pixel region.

16. The method for detecting a display panel according to claim 13, wherein the extending direction of the first side and the second side is consistent with the extending direction of the gate line, and wherein:
   if a display mode of the display panel is in a normally white mode, the method further comprises inputting a voltage for displaying a black state to a data line and inputting a turn-on voltage to the gate line, determining the light transmitting section being lighted up as an abnormality mark, and determining the data line corresponding to the abnormality mark as an open circuit, or
   if a display mode of the display panel is in a normally black mode, the method further comprises inputting a voltage for displaying a white state to the data line and inputting a turn-on voltage to the gate line, determining the light transmitting section being unlighted as an abnormality mark, and determining the data line corresponding to the abnormality mark as an open circuit.

17. The method for detecting a display panel according to claim 16, wherein inputting the turn-on voltage to the gate line comprises inputting a voltage only to a gate line in the dummy pixel region.

18. The method for detecting a display panel according to claim 13, wherein:
   if an abnormality mark occurs in the dummy pixel region on one side of opposite sides of the display region, the method further comprises determining that the line in the display region is abnormal, or
   if an abnormality marks occurs in the dummy pixel region on both opposite sides of the display region, the method further comprises determining that the line in at least one of the dummy pixel region and a peripheral circuit is abnormal.

* * * * *

UNITED STATES PATENT AND TRADEMARK OFFICE
CERTIFICATE OF CORRECTION

PATENT NO. : 11,086,060 B2
APPLICATION NO. : 16/086970
DATED : August 10, 2021
INVENTOR(S) : Liqing Yao et al.

Page 1 of 1

It is certified that error appears in the above-identified patent and that said Letters Patent is hereby corrected as shown below:

In the Specification

Column 9, Line 56, delete "example, LO" and insert therefor -- example, L0 --.
Column 9, Line 62, delete "LO voltage" and insert therefor -- L0 voltage --.
Column 9, Line 65, delete "LO voltage" and insert therefor -- L0 voltage --.
Column 10, Line 30, delete "example, LO" and insert therefor -- example, L0 --.

Signed and Sealed this
Eleventh Day of January, 2022

Drew Hirshfeld
*Performing the Functions and Duties of the*
*Under Secretary of Commerce for Intellectual Property and*
*Director of the United States Patent and Trademark Office*